(12) United States Patent
Cho

(10) Patent No.: US 9,455,190 B2
(45) Date of Patent: Sep. 27, 2016

(54) SEMICONDUCTOR APPARATUS HAVING TSV AND TESTING METHOD THEREOF

(71) Applicant: SK hynix Inc., Icheon-si Gyeonggi-do (KR)

(72) Inventor: Hyung Jun Cho, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/822,727

(22) Filed: Aug. 10, 2015

(65) Prior Publication Data

US 2015/0348857 A1 Dec. 3, 2015

Related U.S. Application Data

(63) Continuation-in-part of application No. 14/014,523, filed on Aug. 30, 2013, now abandoned.

(30) Foreign Application Priority Data

Sep. 3, 2012 (KR) ........................ 10-2012-0096994

(51) Int. Cl.
| | |
|---|---|
| *H01L 21/66* | (2006.01) |
| *H01L 21/768* | (2006.01) |
| *H01L 21/304* | (2006.01) |
| *H01L 21/02* | (2006.01) |
| *H01L 23/48* | (2006.01) |

(52) U.S. Cl.
CPC ... *H01L 21/76898* (2013.01); *H01L 21/02107* (2013.01); *H01L 21/304* (2013.01); *H01L 22/14* (2013.01); *H01L 22/22* (2013.01); *H01L 22/34* (2013.01); *H01L 23/481* (2013.01); *H01L 2224/13* (2013.01); *H01L 2924/0002* (2013.01)

(58) Field of Classification Search
CPC .................. H01L 23/481; H01L 2225/06541; H01L 2224/16146; H01L 23/49827; H01L 2224/13025; H01L 23/5226; H01L 21/743; H01L 23/5384; H01L 21/486; H01L 2224/05009; H01L 21/76877; H01L 2223/6616
See application file for complete search history.

(56) References Cited

U.S. PATENT DOCUMENTS

| | | | | |
|---|---|---|---|---|
| 8,907,494 | B2* | 12/2014 | Collins | ............... H01L 25/0657 257/774 |
| 9,111,895 | B2* | 8/2015 | Pagani | .............. H01L 21/76898 |
| 2012/0018723 | A1* | 1/2012 | Su | ........................... H01L 22/34 257/48 |
| 2012/0025846 | A1* | 2/2012 | Minas | ................ G01R 31/2853 324/606 |
| 2013/0342231 | A1* | 12/2013 | Alfano | ............... G01R 31/2884 324/750.16 |
| 2014/0367684 | A1* | 12/2014 | Coster | .................... H01L 22/14 257/48 |

* cited by examiner

*Primary Examiner* — Bac Au
(74) *Attorney, Agent, or Firm* — William Park & Associates Ltd.

(57) ABSTRACT

A test method of a semiconductor apparatus before a wafer is ground may include applying voltages to a bump electrically coupled to a through-silicon via (TSV) which is buried in the wafer and a first conductive layer formed to be electrically connected to a rear surface of the TSV, wherein the first conductive layer is withdrawn into an upper surface of the wafer. The method may include measuring a voltage between the bump and the first conductive layer. The method may include comparing the measured voltage to a preset reference voltage. The method may include determining the TSV as a normal TSV in which no fail occurs, according a comparing result, and grinding the wafer to expose the rear surface of the TSV.

9 Claims, 9 Drawing Sheets

SEMICONDUCTOR APPARATUS HAVING TSV AND TESTING METHOD THEREOF

CROSS-REFERENCES TO RELATED APPLICATION

This application is a continuation-in-part of application Ser. No. 14/014,523, filed Aug. 30, 2013, titled "SEMICONDUCTOR APPARATUS HAVING TSV AND TESTING METHOD THEREOF".

BACKGROUND

1. Technical Field

Various embodiments relate to a semiconductor apparatus, and more particularly, to a semiconductor apparatus having through-silicon vias (TSVs) and a test method thereof.

2. Related Art

With the development of semiconductor memory technology, high integration and high performance have been required for packaging technology for a semiconductor integrated circuit apparatus. Thus, in order to replace a two-dimensional (2D) structure in which semiconductor chips having an integrated circuit implemented therein are two-dimensionally arranged over a printed circuit board (PCB) through a wire or bump, a variety of three-dimensional (3D) structures have been developed in which a plurality of semiconductor chips are vertically stacked.

The 3D structure may be implemented through stack packaging technology. The stack package technology may be roughly divided into technology for packaging stacked semiconductor chips at a time and technology for stacking individually-packaged semiconductor chips.

The semiconductor chips stacked in a vertical direction to a surface of the semiconductor chip are mounted on a substrate for a semiconductor package, while electrically coupled to each other through metallic wires or TSVs.

When metallic wires are used in a stack package, performance may be reduced because electrical signals are exchanged through the metallic wires has long length. Since a large number of wires are used, electrical characteristics for example, a short between neighboring wires, may be degraded. Furthermore, since the semiconductor substrate may require an additional area to prevent the short between the neighboring wires, the entire size of the package may be increased. Since a gap for wire bonding between the semiconductor chips is required, the height of the package may be increased.

On the other hand, a stack package using TSVs has a structure which couples semiconductor chips in a vertical direction so as to couple transistors or interconnections formed over a chip to the bottom of the chip. The stack package may reduce a distance between the upper and lower chips to thereby reduce a signal loss, than the stack package having the wire bonding structure. Thus, high-speed and low-power communication may be realized between the chips. In particular, when the TSV is electrically applied as a power line, an off-chip driver may be designed to have low power consumption. Thus, the duration of use for mobile electronic products may be increased to secure high marketability.

Referring to FIG. 1, the semiconductor memory device includes a plurality of chips 10_1, 10_2, and 10_3 which are physically and electrically stacked using TSVs 20. Each of the chips has a cell area and a peripheral circuit area for realizing the function of the semiconductor memory device.

Among the plurality of chips, the chip 10_1 positioned at the lowermost part is a master chip to buffer an external signal applied from an external controller, and the chips 10_2 to 10_n positioned over the master chip 10-1 are slave chips which are physically or electrically connected to the master chip 10-1 using the TSVs 20.

Referring to FIGS. 2 and 3, the TSV 20 is formed through a silicon substrate 30, that is, each chip 10-1, 10-2, or 10-3. The silicon substrate 30 is a P-type silicon substrate having a low doping concentration or N-type silicon substrate having a low doping concentration. The TSV 20 is made of a conductive material including a metal such as copper (Cu). Furthermore, an insulating material 40 made of thin silicon oxide ($SiO_2$) is formed between the TSV 20 and the silicon substrate 30.

Thus, the TSV 20 and the peripheral structure thereof may form a MOS capacitor structure, which includes the TSV 20 made of a conductive material, the insulating material 40, and the silicon substrate 30.

As such, the TSV 20 is provided to couple the plurality of chips 10_1, 10_2, and 10_n and is additionally formed in a completed semiconductor memory device. Thus, in order for the semiconductor memory device to perform an accurate operation and in order to develop the packaging technology for 3D structures, a test should be performed on the TSV.

However, a TSV test is performed after packaging is completed. That is, a TSV has been tested in a state where a plurality of chips are stacked and completely packaged. Then, when a fail is discovered in the tested TSV, the failed TSV is replaced to a redundancy TSV.

Therefore, a necessary number of redundancy TSVs should be prepared according to a TSV fail ratio. When fails of the TSV are larger than the prepared redundancy TSVs, the entire stack package should be discarded. Furthermore, when a fail is not discovered in the TSV, the prepared redundancy TSVs become useless. Thus, the fabrication cost inevitably increases due to the unnecessary redundancy TSVs.

SUMMARY

In an embodiment, a test method of a semiconductor apparatus includes the steps of: forming a through-silicon via (TSV) in a semiconductor substrate; forming a test conductive layer to surround of a circumference of the TSV, with insulating from the TSV; applying a first voltage to the TSV; applying a second voltage being different from the first voltage to the test conductive layer; determining a fail of the TSV using to a voltage between the first voltage and the second voltage; grinding the semiconductor substrate to expose a rear surface of the TSV; and packaging a resultant of the semiconductor substrate.

In an embodiment, a test method of a semiconductor apparatus before a wafer is ground may include applying voltages to a bump electrically coupled to a through-silicon via (TSV) which is buried in the wafer and a first conductive layer formed to be electrically connected to a rear surface of the TSV, wherein the first conductive layer is withdrawn into an upper surface of the wafer. The method may include measuring a voltage between the bump and the first conductive layer. The method may include comparing the measured voltage to a preset reference voltage. The method may include determining the TSV as a normal TSV in which no fail occurs, according a comparing result, and grinding the wafer to expose the rear surface of the TSV.

BRIEF DESCRIPTION OF THE DRAWINGS

Features, aspects, and embodiments are described in conjunction with the attached drawings, in which.

DETAILED DESCRIPTION

Hereinafter, a semiconductor apparatus having TSVs and a test method thereof according to the present invention will be described below with reference to the accompanying drawings through exemplary embodiments.

Figure 1:
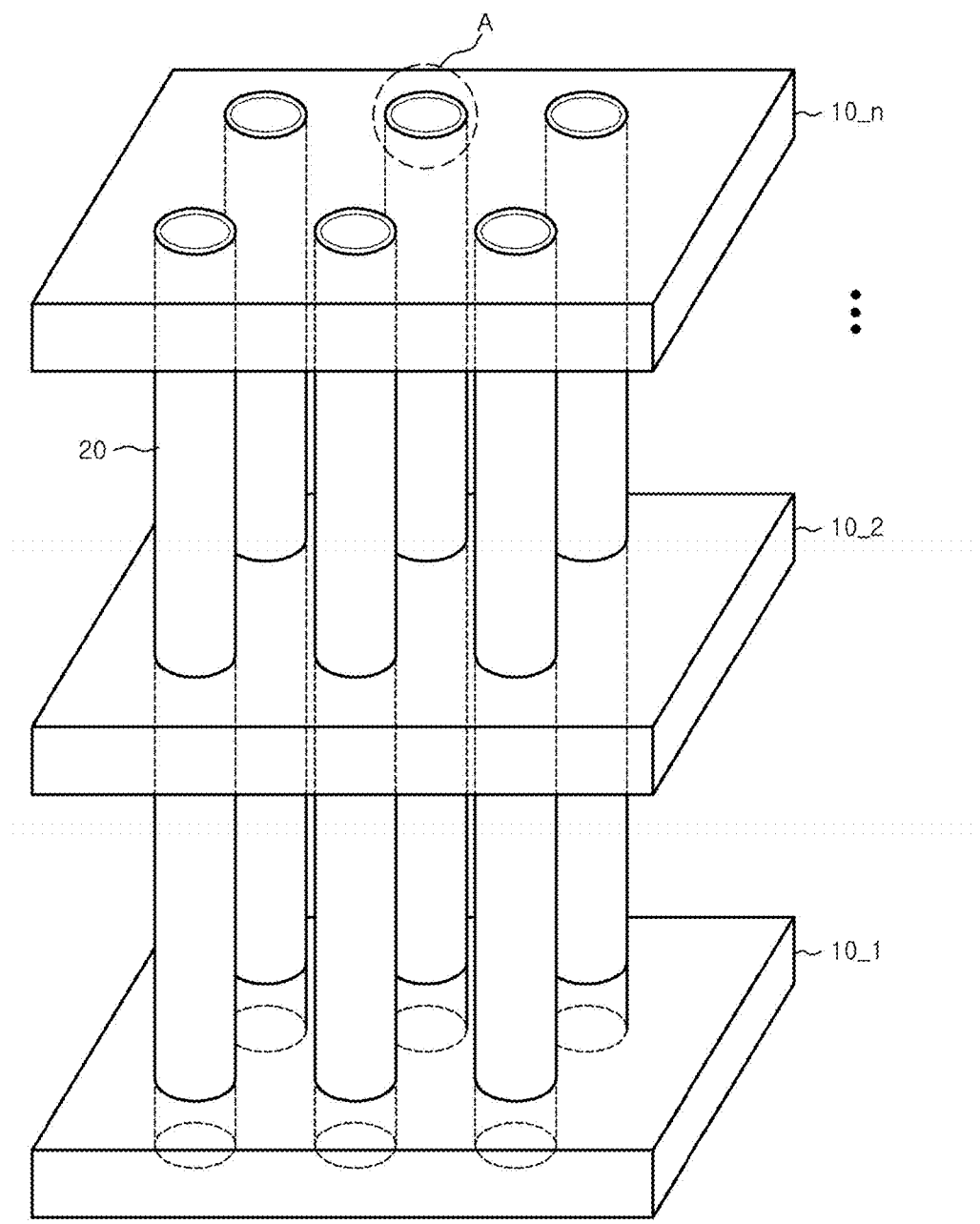
FIG. 1 schematically illustrates the structure of a 3D semiconductor memory device in which a plurality of chips are stacked through a TSV.
Figure 2:
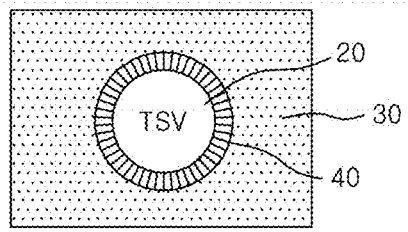
FIG. 2 is a plan view of a region "A" of FIG. 1.
Figure 3:
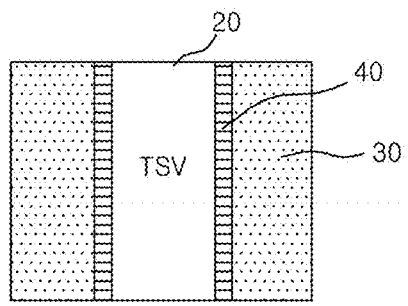
FIG. 3 is a cross-sectional view of the region "A" of FIG. 1.
Figure 4:
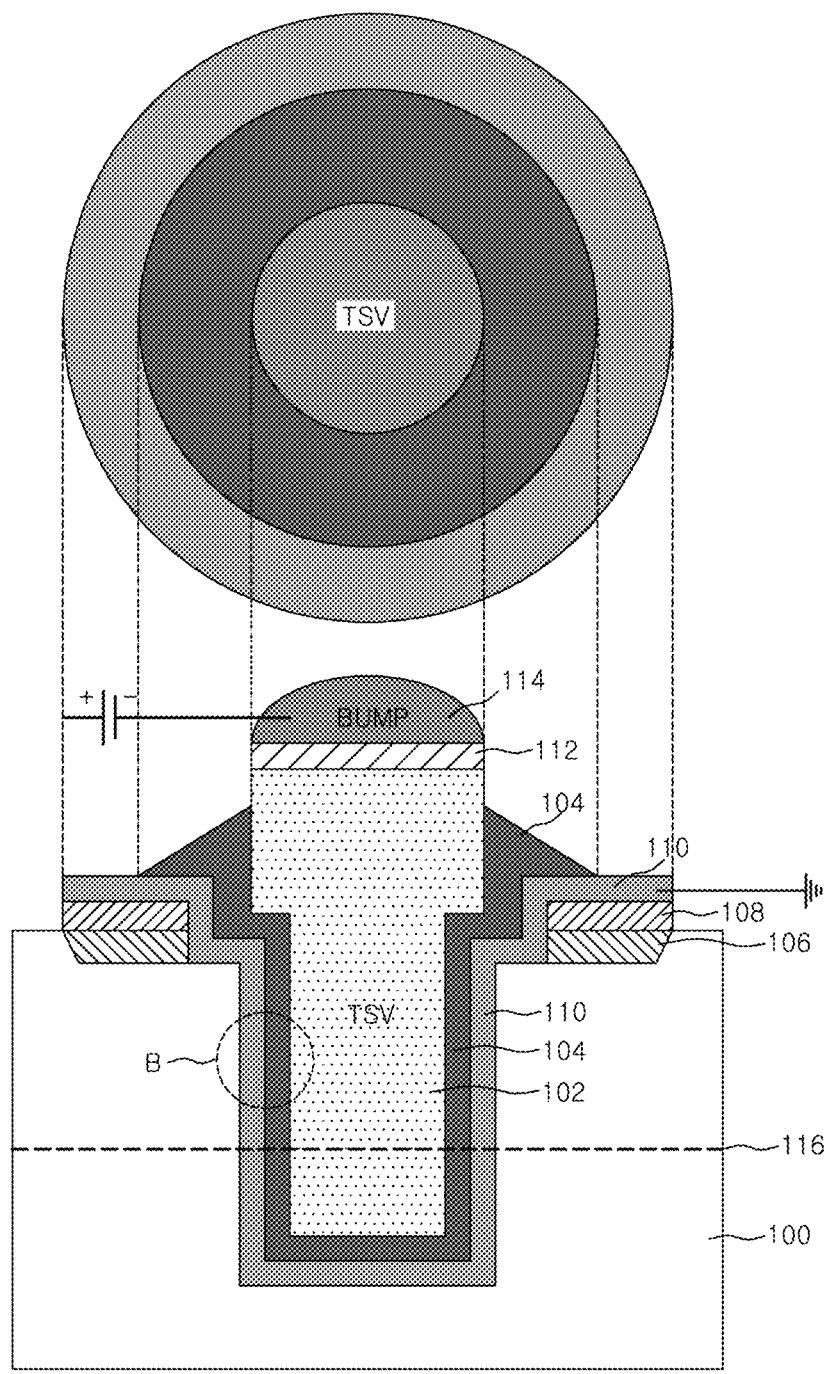
FIG. 4 illustrates a TSV structure according to an embodiment.

Referring to FIG. 4, a semiconductor apparatus includes a vertical through-silicon via (TSV) 102 formed in a P-type or N-type silicon substrate 100 having a low doping concentration. The TSV 102 may be made of a conductive material, for example a metal such as Cu.

Between the TSV 102 and the silicon substrate 100, a first insulating layer 104 made of a high-k material (k is dielectric constant) may be formed. Thus, the TSV 102 and a peripheral structure represented by symbol "B" may form a MOS capacitor structure, which includes the TSV 102 made of a conductive material, the first insulating layer 104 made of an insulating material, and the silicon substrate 100.

Between the first insulating layer 104 and the silicon substrate 100, a first conductive layer 110 may be formed. The first conductive layer 110 may be made of a stack layer of Cu and Ti, for example the Cu layer may be formed on the Ti layer. The first conductive layer 110 may be provided as a test layer. The first conductive layer 110 may be configured to be withdrawn to the surface of the semiconductor substrate 100, to be connected to a voltage terminal, for example a ground terminal.

An ohmic contact layer 106 may be formed at the surface of the silicon substrate 100 around the TSV 102. A second insulating layer 108 may be formed over the ohmic contact layer 106. The ohmic contact layer 106 may be formed of a doping area and the doping type and concentration of the ohmic contact 106 may be properly adjusted according to the condition of the silicon substrate 100. For example, when the silicon substrate 100 is a P-type silicon substrate having a low doping concentration, the ohmic contact layer 106 is formed with an N+ well having a high doping concentration. On the other hand, when the silicon substrate 100 is an N-type silicon substrate having a low doping concentration, the ohmic contact layer 106 is formed with a P+ well having a high doping concentration.

A second conductive layer 112 may be formed on the TSV 102, and a bump 114 may be formed on the second conductive layer 112. For example, the second conductive layer 112 may be made of Ni, and the bump 114 may be made of SnAu. The bump 114 may be used as an outer connecting member.

Furthermore, a grinding line 116 may indicate a grinding position of a rear surface of a wafer, which is set to expose the TSV 102. Thus, after the TSV 102 corresponding to a final unit structure is formed in the silicon substrate 100, a grinding process is performed on the rear surface of the wafer (the silicon substrate: 100) to the grinding line 116 so as to expose the TSV 102. That is, the TSV 102 may include a structure which penetrates the silicon substrate 100. Then, the wafer (the silicon substrate: 100) may be sawed to separate the wafer into individual chips. Two or more chips may be vertically stacked on a package substrate (not shown), using TSVs, the stacked chips are molded, and solder balls are mounted on the bottom surface of the package substrate. Then, the stack package process is completed.

For example, a VDD voltage applied through the bump 114 may be supplied to the TSV 102 through the second conductive layer 112. The first conductive layer 110 may receive a ground voltage (or VSS voltage).

In this embodiment, the test for the TSV 102 may perform at a wafer level, that is, a non-grinding state. That is, the test for the TSV 102 may be perform before the wafer is ground.

Generally, a rear surface of a general TSV at the non-grinding state is covered by the wafer. Thus, it is impossible to test for a general TSV of the non-grinding state. However, the TSV 102 of the present embodiment includes the first conductive layer 110 formed to be exposed outside with connecting to the rear surface of the TSV 102. The test of the TSV 102 is performed by the first conductive layer 110 without a grinding step. The wafer level refers to the state of a wafer before the wafer is sawed to separate unit chips on the wafer into individual chips. Thus, it is possible to prevent the increase of fabrication cost caused by unnecessary redundancy TSVs.

Now, the TSV test method according to the embodiment of the present invention will be described in more detail.

Figure 5:
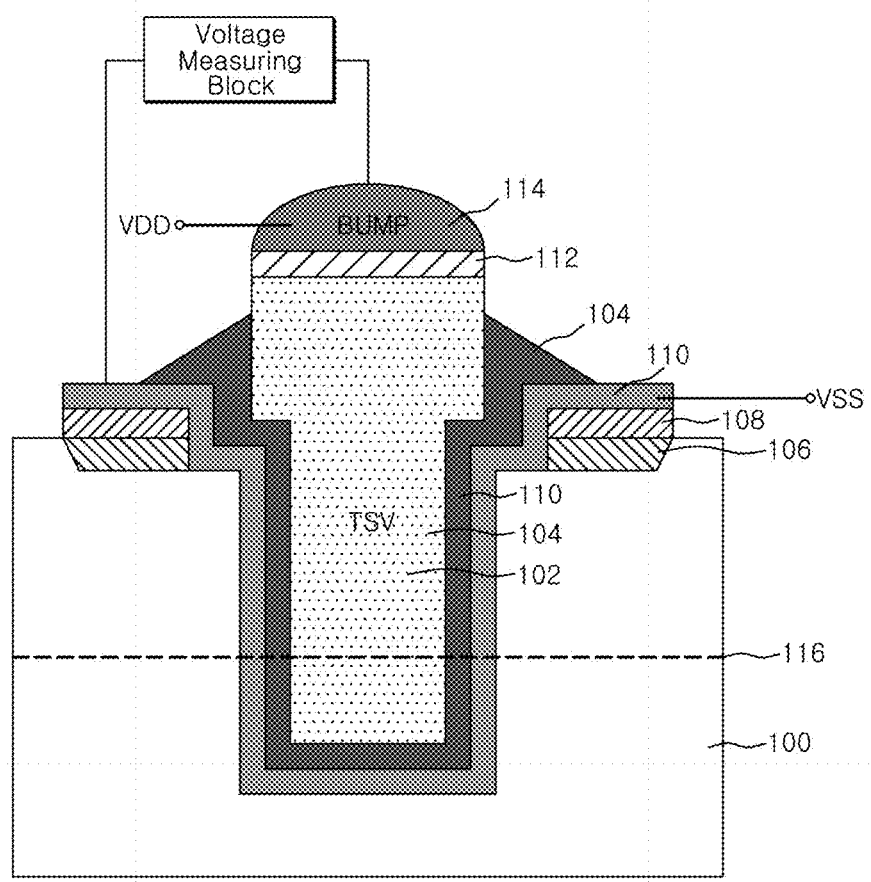
FIG. 5 schematically illustrates a TSV test method according to a first embodiment.

Referring to FIG. 5, a first voltage, for example, a VDD voltage may be applied to the bump 114 positioned over the TSV 102 and a second voltage, for example, a VSS voltage may be applied to the first conductive layer 110 surrounding the TSV 102 at the wafer-level. Then, a voltage between the bump 114 and the first conductive layer 110 may be directly measured by a voltage measuring block 120, and whether or not a fail occurred in the TSV 102 may be checked according to the measurement result.

Figure 6:
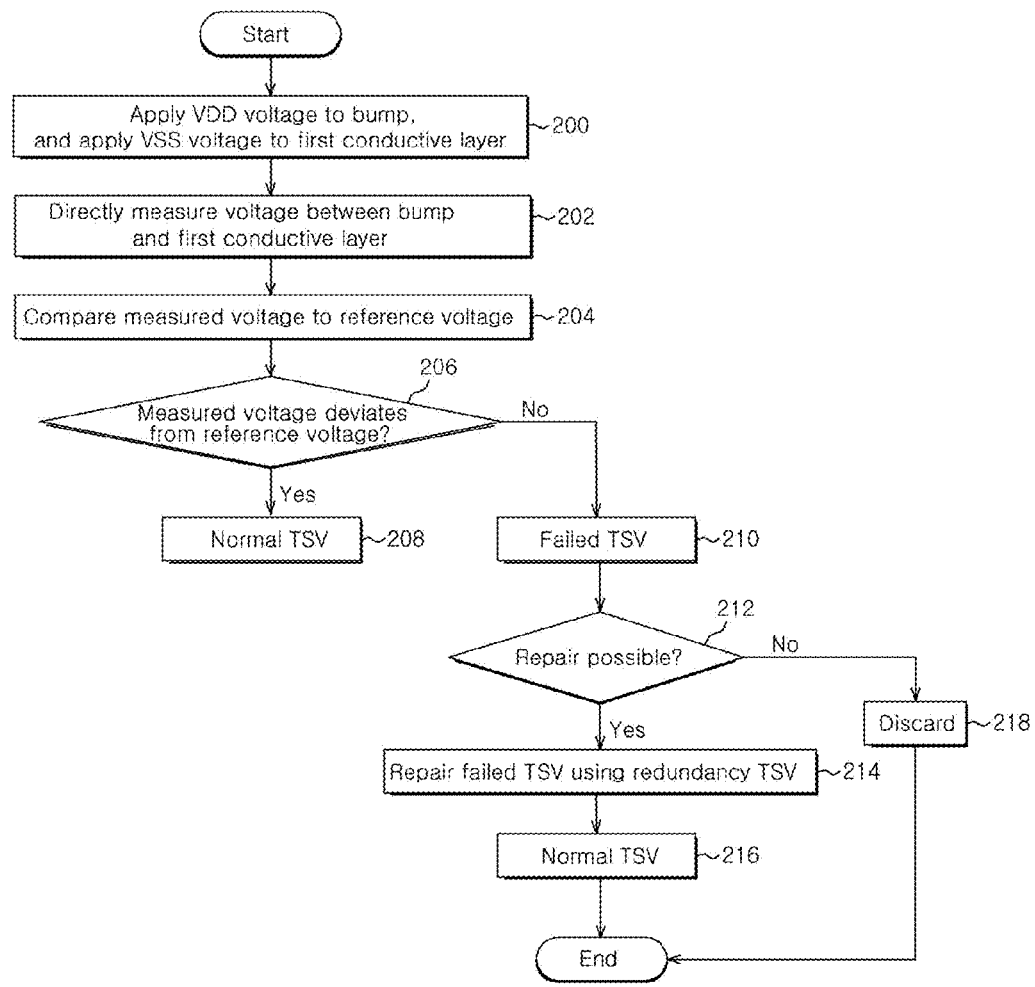
FIG. 6 is a flowchart illustrating the TSV test method according to the first embodiment.

Referring to FIG. 6, the VDD voltage may be applied to the bump 114 and the VSS voltage may be applied to the first conductive layer 110 surrounding the TSV 102, at step S200.

The voltage between the bump 114 and the first conductive layer 110 may be directly measured by the voltage measuring block 120, at step S202.

The measured voltage may be compared to a preset reference voltage, at step S204.

According to the comparison result of the step S204, whether or not the measured voltage deviates from the preset reference voltage may be determined at step S206.

As the determination result, when the measured voltage does not deviate from the preset reference voltage, the procedure may proceed to step S208 to determine the TSV 102 as a normal TSV in which no fail occurs.

On the other hand, when the measured voltage deviates from the preset reference voltage, the procedure may proceed to step S210 to determine the TSV 102 as a failed TSV.

Then, whether or not the failed TSV can be repaired may be determined at step S212.

As the determination result, when the failed TSV can be repaired, the procedure may proceed to step S214 to repair the failed TSV using a redundancy TSV.

Then, the repaired TSV may be used as a normal TSV at the step S214.

When it is determined at the step S212 that the failed TSV cannot be repaired, the procedure may proceed to step S218 at which the failed TSV is classified as a final failed TSV and then discarded.

Figure 7:
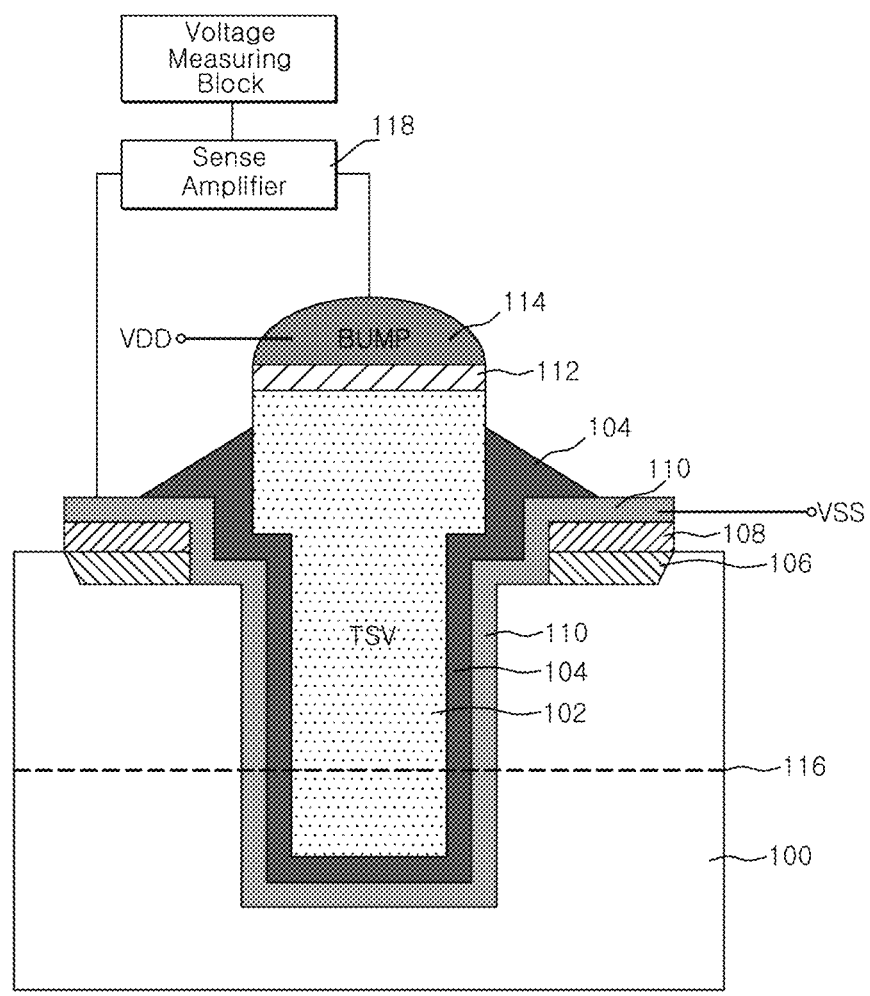
FIG. 7 schematically illustrates a TSV test method according to a second embodiment.

Referring to FIG. 7, the first voltage, for example, the VDD voltage may be applied to the bump 114 positioned over the TSV 102, and the second voltage, for example, the VSS voltage may be applied to the first conductive layer 110 surrounding the TSV 102, as above. Then, a sense amplifier 118 may be used to measure the voltage between the bump 114 and the first conductive layer 110, and whether or not a fail occurred in the TSV 102 is checked according to the measurement result. That is, the sense amplifier 118 may be connected between the bump 114 and the first conductive layer 110. A voltage measuring block 120 may be connected to the sense amplifier 118.

Figure 8:
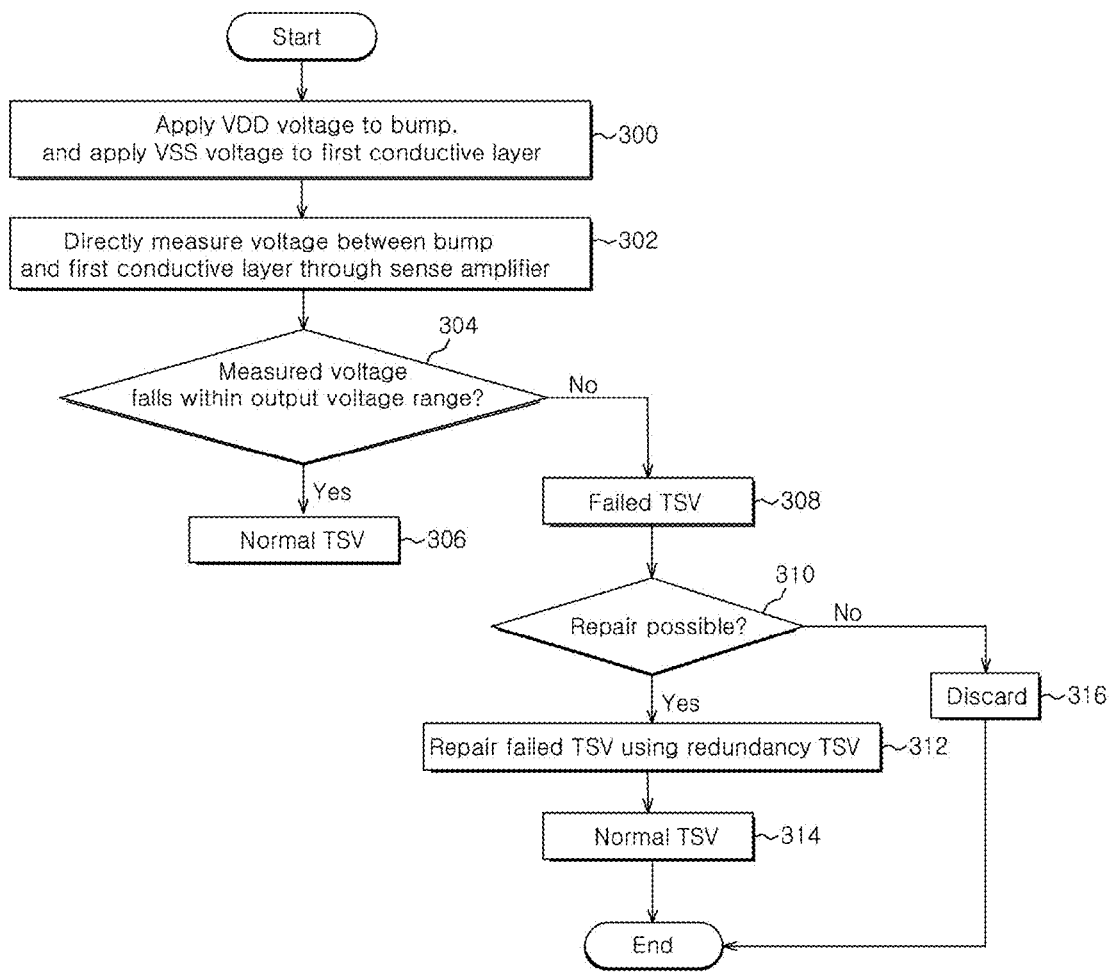
FIG. 8 is a flowchart illustrating the TSV test method according to the second embodiment.

Referring to FIG. 8, the VDD voltage may be applied to the bump 114 and the VSS voltage may be applied to the first conductive layer 110 surrounding the TSV 102, at step S300.

The voltage between the bump 114 and the first conductive layer 110 is measured by the sense amplifier 118, at step S302.

Whether or not the measured voltage falls within an output voltage range VOH/VOL may be determined at step S304.

As the determination result of the step S304, when the measured voltage falls within the output voltage range, the procedure may proceed to step S306 to determine the TSV 102 as a normal TSV in which no fail occurs.

On the other hand, when the measured voltage deviates from the output voltage range, the procedure may proceed to step S308 to determine the TSV 102 as a failed TSV.

Whether or not the failed TSV can be repaired may determine at step S310.

As the determination result, when the failed TSV can be repaired, the procedure may proceed to step S312 to repair the failed TSV using a redundancy TSV.

Then, the procedure may proceed to step S314 to use the repaired TSV as a normal TSV.

On the other hand, when the failed TSV cannot be repaired, the procedure may proceed to step S316 at which the failed TSV is classified as a final failed TSV and then discarded.

Figure 9:
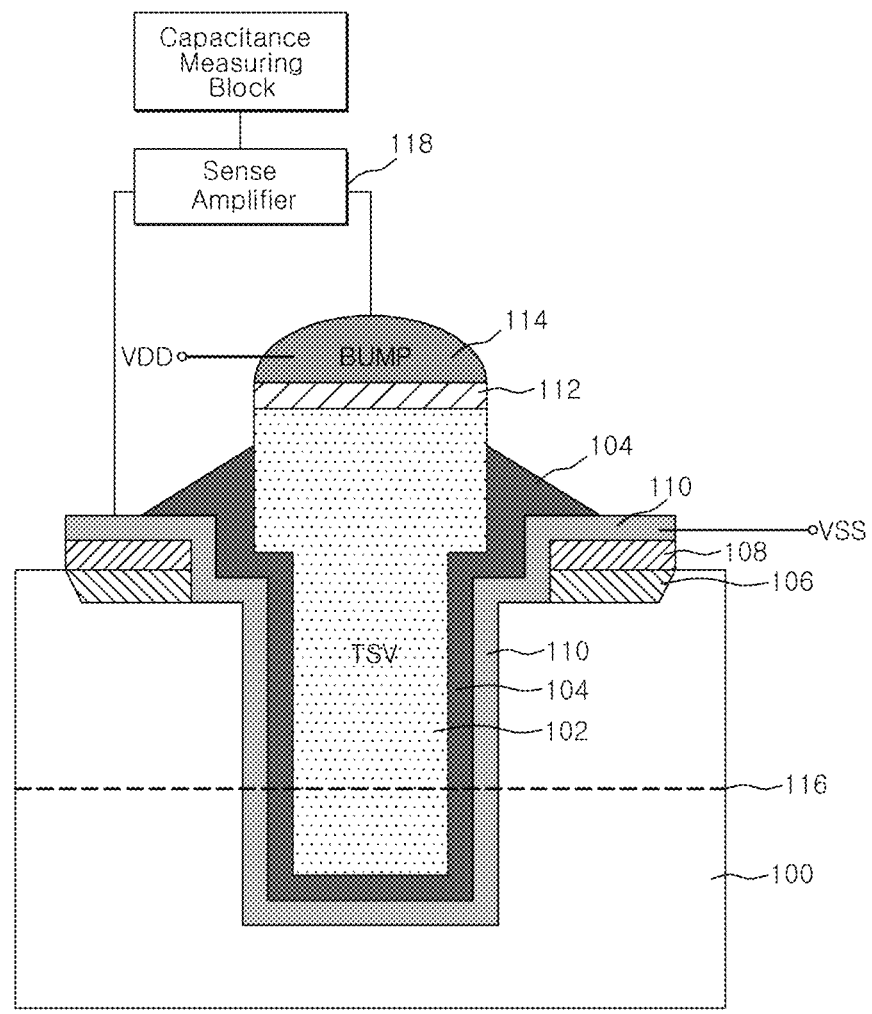
FIG. 9 schematically illustrates a TSV test method according to a third embodiment.

Referring to FIG. 9, the first voltage, for example, the VDD voltage is applied to the bump 114 positioned over the TSV 102, and the second voltage, for example, the VSS voltage is applied to the first conductive layer 110 surrounding the TSV 102, as above. Then, a parasitic capacitor may be generated between the TSV 102. Capacitance of the MOS capacitor may be measured using the sense amplifier 118 and a capacitor measuring block 125, and whether or not a fail occurred in the TSV 102 is checked according to the measurement result. The MOS capacitor includes the TSV 102, the first insulating layer 104, and the silicon substrate 100.

Figure 10:
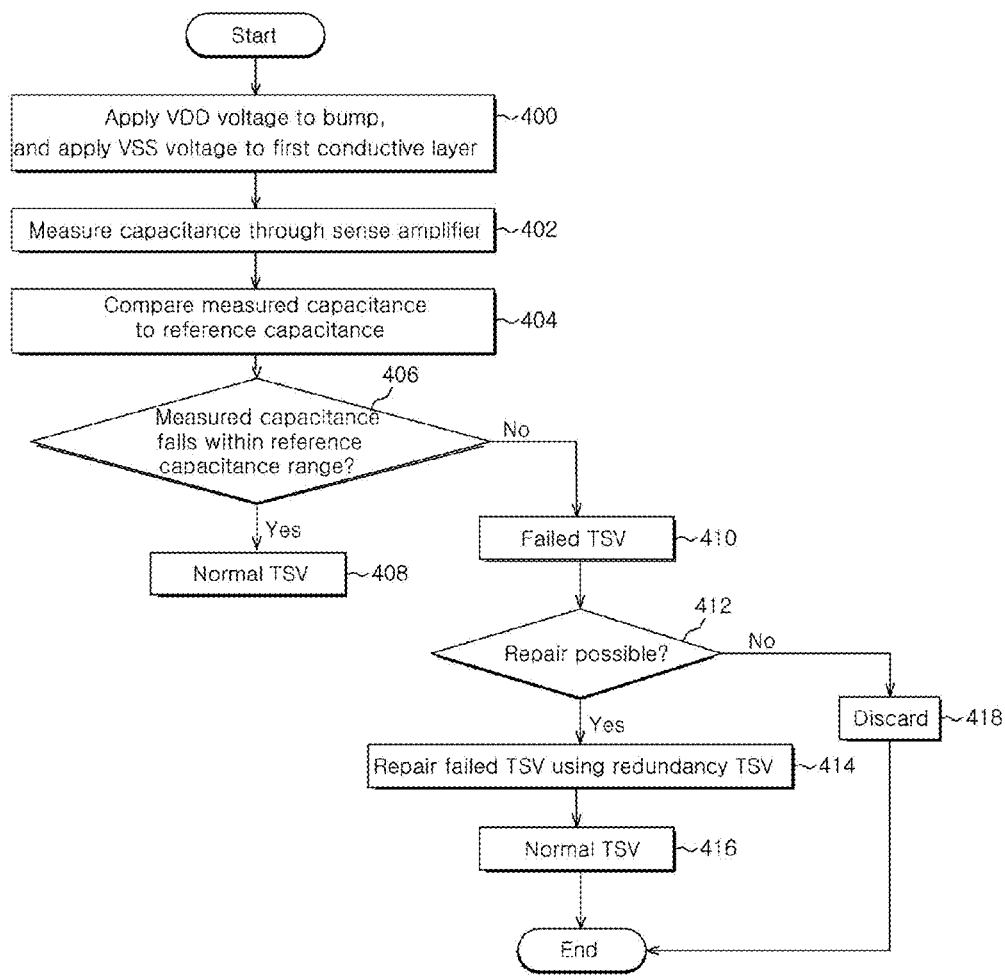
FIG. 10 is a flowchart illustrating the TSV test method according to the third embodiment.

Referring to FIG. 10, the VDD voltage may be applied to the bump 114 and the VSS voltage may be applied to the conductive layer 110 positioned under the bump 114, at step S400.

The capacitance of the MOS capacitor including the TSV 102, the first insulating layer 104, and the silicon substrate 100 may be measured through the sense amplifier 118 and the capacitance measuring block 125 at step S402.

The measured capacitance may be compared to preset reference capacitance at step 404.

According to the comparison result of the step S404, whether or not the measured capacitance falls within the preset reference capacitance range may be determined through the sense amplifier 120 at step S406.

As the determination result, when the measured capacitance falls within the preset reference capacitance range, the procedure may proceed to step S408 to determine the TSV 102 as a normal TSV in which no fail occurs.

On the other hand, when the measured capacitance does not fall within the preset reference capacitance range, the procedure may proceed to step S410 to determine the TSV 102 as a failed TSV.

Then, whether or not the failed TSV can be repaired may be determined at step S412.

As the determination result, when the failed TSV can be repaired, the procedure may proceed to step S414 to repair the failed TSV using a redundancy TSV.

Then, the procedure may proceed to step S416 to use the repaired TSV as a normal TSV.

On the other hand, when the failed TSV cannot be repaired, the procedure may proceed to step S418 at which the failed TSV is classified as a final failed TSV and then discarded.

According to the conventional test method, whether or not a fail occurred in a TSV is tested after packaging is completed. Therefore, when the number of redundancy TSVs for repairing failed TSVs is smaller than needed, the entire memory should be discarded, and a larger number of redundancy TSVs than needed should be provided to repair the failed TSVs. Thus, the entire fabrication cost inevitably increases.

According to the embodiments of the present invention, however, whether or not a fail occurred in a TSV may be tested at the wafer level before packaging, in order to filter a TSV in which a fail such as open/short/leakage/void occurred. Then, as a repair process using a redundancy TSV is performed if necessary, the discard rate of the memory package may be lowered, and the fabrication cost may be reduced.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A test method of a semiconductor apparatus before a wafer is ground, comprising the steps of:

applying voltages to a bump electrically coupled to a through-silicon via (TSV) which is buried in the wafer and a first conductive layer formed to be electrically connected to a rear surface of the TSV, wherein the first conductive layer is withdrawn into an upper surface of the wafer;

measuring a voltage between the bump and the first conductive layer;

comparing the measured voltage to a preset reference voltage;

determining the TSV as a normal TSV in which no fail occurs, according a comparing result; and grinding the wafer to expose the rear surface of the TSV.

2. The test method according to claim 1, wherein a VDD voltage is applied to the bump, and a VSS voltage is applied to the conductive layer.

3. The test method according to claim 1, further comprising the steps of:

determining whether or not the failed TSV can be repaired;

repairing the failed TSV using a redundancy TSV when the failed TSV can be repaired; and classifying the failed TSV as a final failed TSV and discarding the failed TSV, when the failed TSV cannot be repaired.

4. The test method according to claim 1, wherein the voltage between the bump and the conductive layer is measured by a voltage measuring block.

5. The test method according to claim 1, wherein the voltage between the bump and the conductive layer is measured by a sense amplifier.

6. The test method according to claim 1, wherein the voltage between the bump and the conductive layer is measured by a capacitance measuring block.

7. The test method according to claim 1, further comprising the step of forming a package structure after determining the TSV as a normal TSV in which no fail occurs.

8. A test method of a semiconductor apparatus, comprising the steps of:

forming a through-silicon via (TSV) in a semiconductor substrate;

forming a test conductive layer to surround of a circumference of the TSV, with insulating from the TSV;

applying a first voltage to the TSV;

applying a second voltage being different from the first voltage to the test conductive layer;

determining a fail of the TSV using to a voltage between the first voltage and the second voltage;

grinding the semiconductor substrate to expose a rear surface of the TSV; and packaging a resultant of the semiconductor substrate.

9. The test method according to claim 8, further comprising the steps of:

determining whether or not the failed TSV can be repaired;

repairing the failed TSV using a redundancy TSV when the failed TSV can be repaired; and classifying the failed TSV as a final failed TSV and discarding the failed TSV, when the failed TSV cannot be repaired.

* * * * *